(12) United States Patent
Chien et al.

(10) Patent No.: US 10,826,288 B1
(45) Date of Patent: Nov. 3, 2020

(54) POWER CIRCUIT FOR REDUCING INRUSH CURRENT

(71) Applicant: Excelliance MOS Corporation, Hsinchu County (TW)

(72) Inventors: Ming-Hung Chien, Hsinchu County (TW); Ching-Tsan Lee, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 16/563,923

(22) Filed: Sep. 8, 2019

(30) Foreign Application Priority Data

May 31, 2019 (TW) .............................. 108118914 A (51) Int. Cl.
| | |
|---|---|
| *H02M 3/156* | (2006.01) |
| *H02M 1/32* | (2007.01) |
| *H02H 9/00* | (2006.01) |
| *H03K 17/082* | (2006.01) |
| *G05F 1/46* | (2006.01) |

(52) U.S. Cl.
CPC ......... *H02H 9/002* (2013.01); *H03K 17/0822* (2013.01); *G05F 1/468* (2013.01)

(58) Field of Classification Search
CPC ........ H02M 3/156; H02M 1/32; H02H 9/002; H03K 17/0822
See application file for complete search history.

(56) References Cited

U.S. PATENT DOCUMENTS

| | | | | |
|---|---|---|---|---|
| 9,450,484 B2 * | 9/2016 | Al-Shyoukh | ........... | H02M 1/36 |
| 9,496,781 B2 * | 11/2016 | Li | ......................... | H02M 3/158 |
| 9,520,770 B2 * | 12/2016 | Sumii | .................... | H02M 3/156 |
| 10,003,252 B2 * | 6/2018 | Daly | ...................... | H02M 3/156 |
| 2013/0049721 A1 * | 2/2013 | Lo | ............................ | G05F 1/575 |
| | | | | 323/280 |

(Continued)

FOREIGN PATENT DOCUMENTS

| | | |
|---|---|---|
| CN | 105048792 | 11/2015 |
| TW | M576669 | 4/2019 |
| WO | 02067279 | 8/2002 |

OTHER PUBLICATIONS

"Office Action of Taiwan Counterpart Application," dated Nov. 7, 2019, p. 1-p. 6.

*Primary Examiner* — Thienvu V Tran
*Assistant Examiner* — Sisay G Tiku
(74) *Attorney, Agent, or Firm* — JCIPRNET (57) ABSTRACT

A power circuit including a switching circuit and a soft start control circuit is provided. A first terminal of the switching circuit is configured to receive an input voltage. A control terminal of the switching circuit receives a control signal. A second terminal of the switching circuit is configured to provide an output voltage. The soft start control circuit generates the control signal according to the output voltage and a first reference voltage to control a turn-on state of the switching circuit. The soft start control circuit switches a slope of the control signal from a first slope to a second slope after the switching circuit is turned on and when a voltage value of the control signal is equal to a second reference voltage, wherein the first slope is less than the second slope to reduce an inrush current at the time when the switching circuit is turned on.

9 Claims, 6 Drawing Sheets

(56) References Cited

U.S. PATENT DOCUMENTS

| | | | |
|---|---|---|---|
| 2013/0307501 A1* | 11/2013 | Kadanka | G05F 1/56 323/274 |
| 2014/0049994 A1* | 2/2014 | Ishii | H02M 1/36 363/49 |
| 2015/0194888 A1* | 7/2015 | Kasai | H02M 1/36 323/271 |
| 2019/0146530 A1* | 5/2019 | Kotrc | G05F 1/468 323/265 |
| 2019/0158074 A1 | 5/2019 | Martini | |

* cited by examiner

POWER CIRCUIT FOR REDUCING INRUSH CURRENT

CROSS-REFERENCE TO RELATED APPLICATION

This application claims the priority benefit of Taiwan application serial no. 108118914, filed on May 31, 2019. The entirety of the above-mentioned patent application is hereby incorporated by reference herein and made a part of specification.

BACKGROUND OF THE INVENTION

Field of the Invention

The disclosure relates to a power circuit, and more particularly, to a power circuit capable of reducing an inrush current.

Description of Related Art

In general, an inrush current is generated at the moment a power circuit is started. The inrush current not only causes a sudden drop in the input voltage of the power circuit, but also causes severe electromagnetic interference (EMI), or even worse, generates an electrical overstress (EOS) and damages the components in the power circuit. Therefore, how to reduce the inrush current generated at the moment the power circuit is started is one of the major issues faced by those skilled in the art.

SUMMARY OF THE INVENTION

In view of the above, the invention provides a power circuit which can effectively reduce the inrush current at the time when the power circuit is started.

A power circuit of the invention includes a switching circuit and a soft start control circuit. A first terminal of the switching circuit is configured to receive an input voltage. A control terminal of the switching circuit is configured to receive a control signal. A second terminal of the switching circuit is configured to provide an output voltage. The soft start control circuit is coupled to the second terminal of the switching circuit to receive the output voltage and is configured to generate the control signal according to the output voltage and a first reference voltage to control a turn-on state of the switching circuit. After the switching circuit is turned on and when a voltage value of the control signal is equal to a second reference voltage, the soft start control circuit switches a slope of the control signal from a first slope to a second slope, wherein the first slope is less than the second slope to reduce an inrush current at the time when the switching circuit is turned on.

In an embodiment of the invention, the switching circuit is a power transistor, and the second reference voltage is greater than a threshold voltage of the power transistor.

In an embodiment of the invention, after the switching circuit is turned on and when the voltage value of the control signal is equal to the second reference voltage, the soft start control circuit switches a slope of the first reference voltage from the first slope to the second slope, so that the soft start control circuit switches the slope of the control signal from the first slope to the second slope according to the output voltage and the first reference voltage.

In an embodiment of the invention, after the switching circuit is turned on and when the voltage value of the control signal is equal to the second reference voltage, the switching circuit switches a slope of the output voltage from the first slope to the second slope in response to the control signal.

In an embodiment of the invention, the soft start control circuit includes a voltage division circuit, a reference voltage generating circuit, and a control main circuit. The voltage division circuit is coupled to the second terminal of the switching circuit to receive the output voltage, and divides the output voltage to generate a feedback voltage. The reference voltage generating circuit is configured to generate the first reference voltage and adjust the slope of the first reference voltage according to the control signal and the second reference voltage. The control main circuit is coupled to the voltage division circuit to receive the feedback voltage, is coupled to the reference voltage generating circuit to receive the first reference voltage, and generates the control signal according to the feedback voltage and the first reference voltage.

In an embodiment of the invention, when the voltage value of the control signal is less than the second reference voltage, the slope of the first reference voltage generated by the reference voltage generating circuit is the first slope. When the voltage value of the control signal is greater than the second reference voltage, the slope of the first reference voltage generated by the reference voltage generating circuit is the second slope.

Based on the above, in the power circuit provided in the embodiments of the invention, the soft start control circuit turns on the switching circuit by using a control signal having the slope being the first slope, and after the switching circuit is turned on and when the voltage value of the control signal is equal to the second reference voltage, the soft start control circuit switches the slope of the control signal from the first slope to the second slope. Since the first slope is less than the second slope, the inrush current generated at the time when the switching circuit is turned on can be reduced to prevent the input voltage from suddenly dropping due to an excessively large inrush current and prevent the switching circuit from being damaged by the excessively large inrush current.

To make the aforementioned more comprehensible, several embodiments accompanied with drawings are described in detail as follows.

BRIEF DESCRIPTION OF THE DRAWINGS

The accompanying drawings constitute a part of this specification and illustrate exemplary embodiments of the invention. The accompanying drawings, together with the description, serve to explain the principles of the invention.

DESCRIPTION OF THE EMBODIMENTS

To facilitate further understanding of the content of the invention, embodiments will be provided below as examples for implementing the invention accordingly. In addition, wherever possible, elements, components, and steps labeled with the same numerals in the drawings and embodiments represent the same or similar components.

Figure 1:
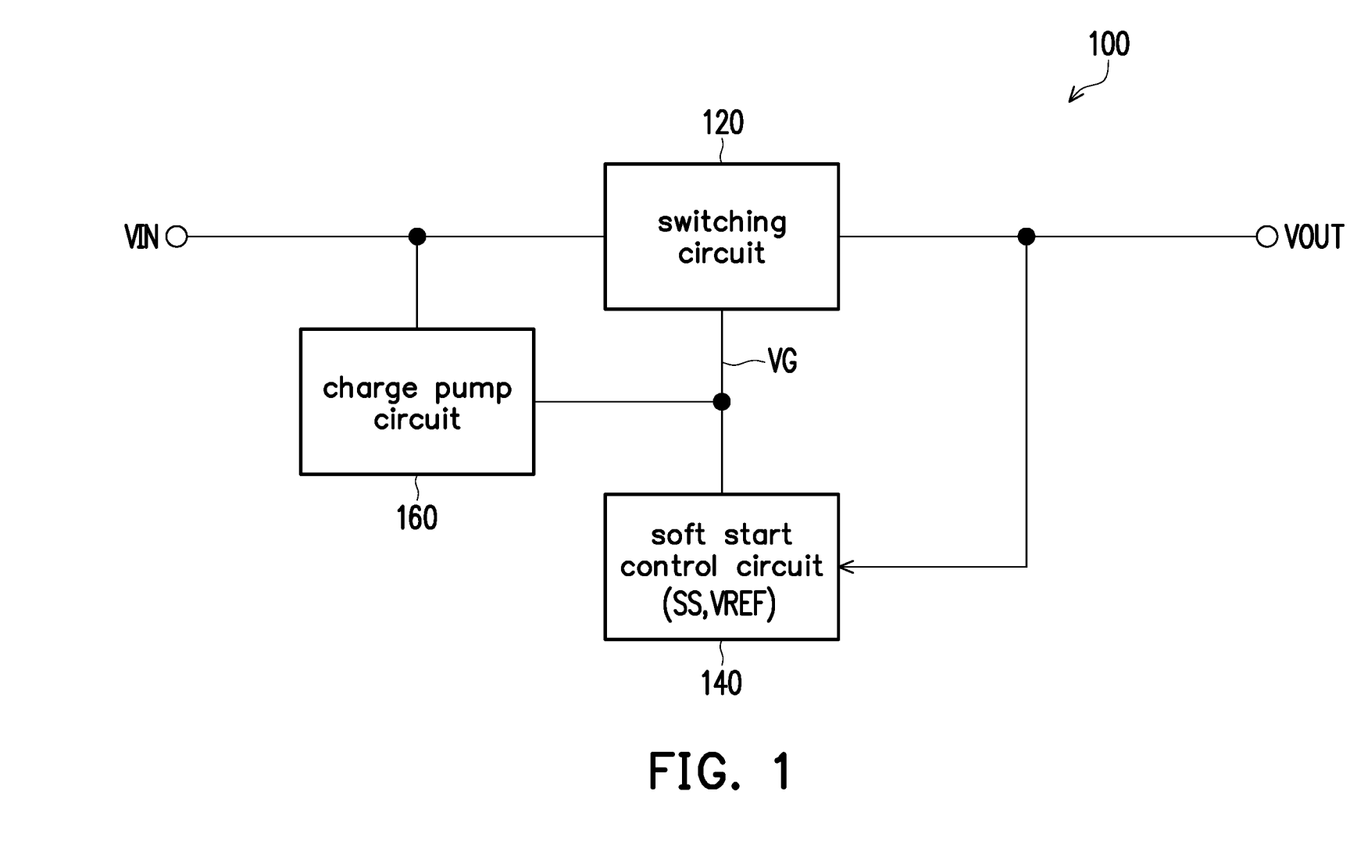
FIG. 1 is a circuit block diagram showing a power circuit according to an embodiment of the invention.

FIG. 1 is a circuit block diagram showing a power circuit 100 according to an embodiment of the invention. Referring to FIG. 1, the power circuit 100 may include a switching circuit 120 and a soft start control circuit 140, but the invention is not limited thereto. The first terminal of the switching circuit 120 is configured to receive an input voltage VIN. The control terminal of the switching circuit 120 is configured to receive a control signal VG. The second terminal of the switching circuit 120 is configured to provide an output voltage VOUT. The soft start control circuit 140 is coupled to the second terminal of the switching circuit 120 to receive the output voltage VOUT. The soft start control circuit 140 may generate the control signal VG according to the output voltage VOUT and a first reference voltage SS to control a turn-on state of the switching circuit 120. The initial value of a slope of the control signal VG generated by the soft start control circuit 140 is a first slope. In addition, when the voltage value of the control signal VG is greater than or equal to the turn-on threshold value of the switching circuit 120, the switching circuit 120 will be turned on and provide the output voltage VOUT.

In particular, after the switching circuit 120 is turned on and when the voltage value of the control signal VG is equal to a second reference voltage VREF, the soft start control circuit 140 switches the slope of the control signal VG from the first slope to a second slope, and the first slope is less than the second slope. Since the soft start control circuit 140 turns on the switching circuit 120 by using the control signal VG having the slope being the first slope, and the first slope is less than the second slope, the inrush current at the time when the switching circuit 120 is turned on can be reduced.

In an embodiment of the invention, the switching circuit 120 may be implemented by using a power transistor, and the second reference voltage VREF is greater than the threshold voltage of the power transistor, but the invention is not limited thereto. In other embodiments of the invention, the switching circuit 120 may also be implemented by using another known power switch.

In an embodiment of the invention, the initial value of a slope of the first reference voltage SS is the first slope. After the switching circuit 120 is turned on and when the voltage value of the control signal VG is equal to the second reference voltage VREF, the soft start control circuit 140 may switch the slope of the first reference voltage SS from the first slope to the second slope, so that the soft start control circuit 140 switches the slope of the control signal VG from the first slope to the second slope according to the output voltage VOUT and the first reference voltage SS.

In the above embodiment of the invention, after the switching circuit 120 is turned on and when the voltage value of the control signal VG is less than the second reference voltage VREF, the switching circuit 120 provides the output voltage VOUT of the first slope according to the control signal VG having the slope being the first slope. After the switching circuit 120 is turned on and when the voltage value of the control signal VG is equal to the second reference voltage VREF, the switching circuit 120 may switch the slope of the output voltage VOUT from the first slope to the second slope in response to the slope change of the control signal VG. After the switching circuit 120 is turned on and when the voltage value of the control signal VG is greater than the second reference voltage VREF, the switching circuit 120 provides the output voltage VOUT of the second slope according to the control signal VG of the second slope.

In an embodiment of the invention, the power circuit 100 may further include a charge pump circuit 160. The charge pump circuit 160 is coupled between the first terminal and the control terminal of the switching circuit 120. The charge pump circuit 160 may be operated together with the soft start control circuit 140 and generate the control signal VG according to the input voltage VIN.

Figure 2:
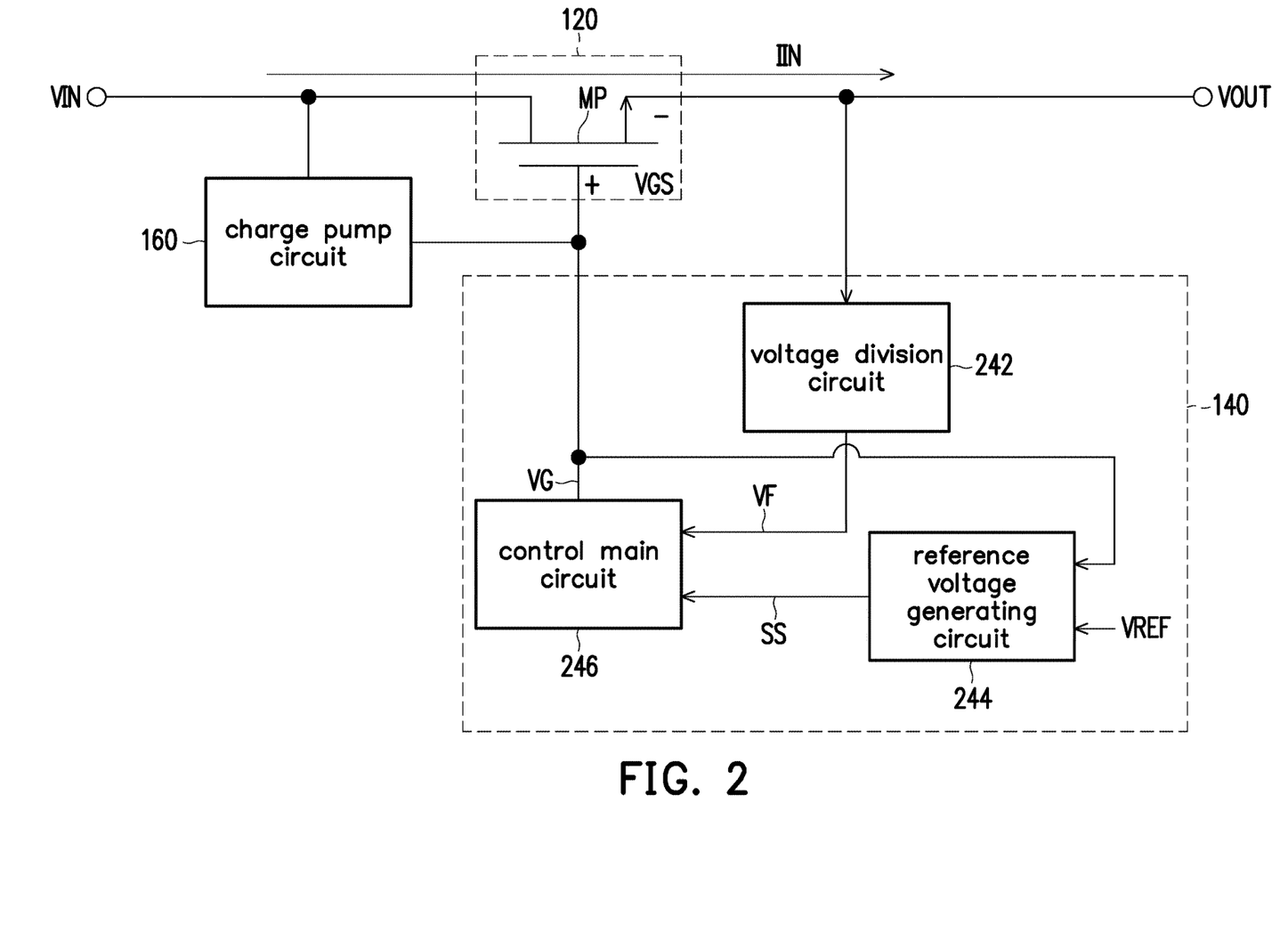
FIG. 2 is a circuit block diagram showing a soft start control circuit according to an embodiment of the invention.

FIG. 2 is a circuit block diagram showing the soft start control circuit 140 according to an embodiment of the invention. For convenience of description, FIG. 2 also shows the switching circuit 120 and the charge pump circuit 160, and the switching circuit 120 is exemplified by a power transistor MP, but the invention is not limited thereto. Referring to FIG. 2, the soft start control circuit 140 may include a voltage division circuit 242, a reference voltage generating circuit 244, and a control main circuit 246. The voltage division circuit 242 is coupled to the second terminal of the switching circuit 120 to receive the output voltage VOUT and divides the output voltage VOUT to generate a feedback voltage VF.

The reference voltage generating circuit 244 is configured to generate the first reference voltage SS and adjust the slope of the first reference voltage SS according to the control signal VG and the second reference voltage VREF. Specifically, when the voltage value of the control signal VG is less than the second reference voltage VREF, the slope of the first reference voltage SS generated by the reference voltage generating circuit 244 is the first slope. Conversely, when the voltage value of the control signal VG is greater than the second reference voltage VREF, the slope of the first reference voltage SS generated by the reference voltage generating circuit 244 is the second slope, and the first slope is less than the second slope.

The control main circuit 246 is coupled to the voltage division circuit 242 to receive the feedback voltage VF and is coupled to the reference voltage generating circuit 244 to receive the first reference voltage SS. The control main circuit 246 may generate the control signal VG and adjust the slope of the control signal VG according to the feedback voltage VF and the first reference voltage SS.

Figure 3:
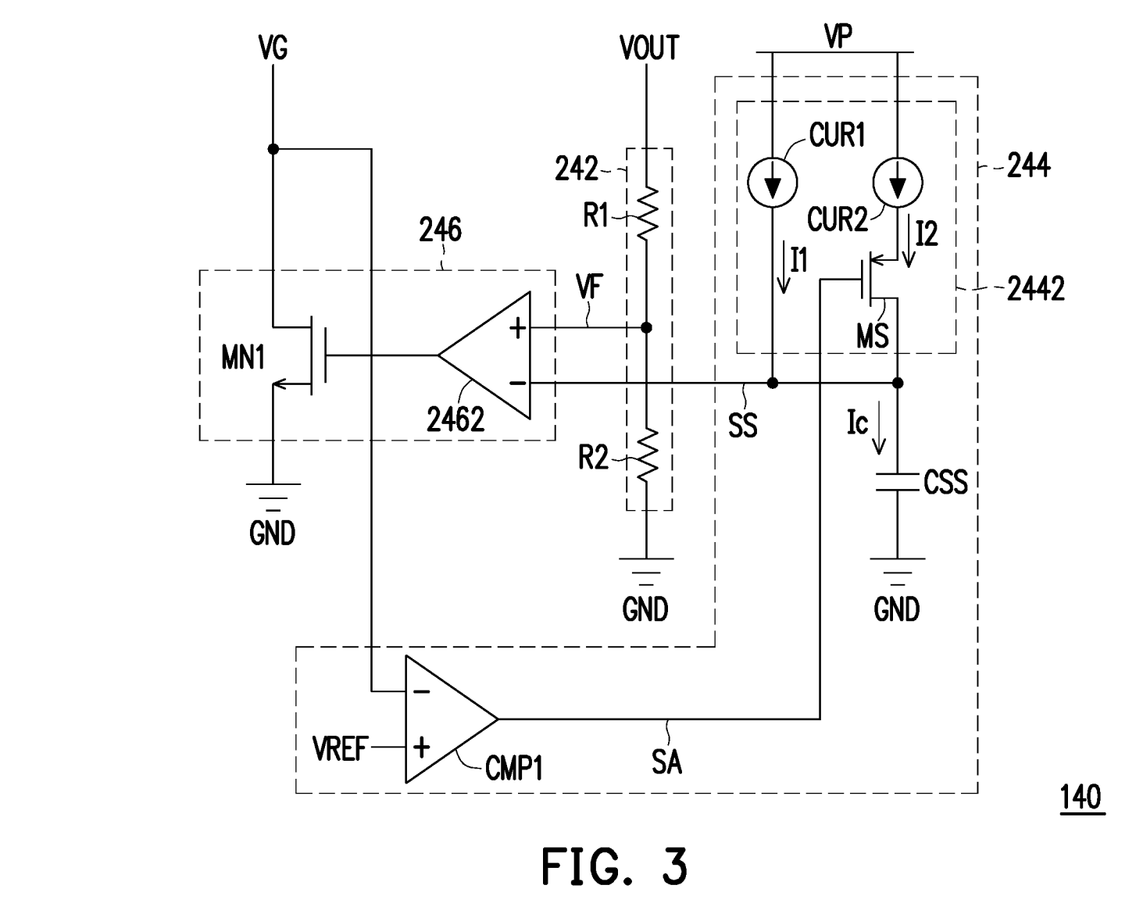
FIG. 3 is a circuit architecture diagram showing the soft start control circuit according to an embodiment of the invention.

FIG. 3 is a circuit architecture diagram showing the soft start control circuit 140 according to an embodiment of the invention. Referring to FIG. 2 and FIG. 3 together, the voltage division circuit 242 may include resistors R1 and R2. The first terminal of the resistor R1 is configured to receive the output voltage VOUT. The second terminal of the resistor R1 and the first terminal of the resistor R2 are coupled to each other to provide the feedback voltage VF. The second terminal of the resistor R2 is coupled to a ground terminal GND.

The reference voltage generating circuit 244 may include a comparator CMP1, a controllable current source 2442, and a capacitor CSS. The comparator CMP1 may compare the control signal VG with the second reference voltage VREF to generate an adjustment signal SA. The controllable current source 2442 is coupled to the comparator CMP1 to receive the adjustment signal SA and adjusts an output current Ic of the controllable current source 2442 according to the adjustment signal SA. The first terminal of the capacitor CSS is coupled to the controllable current source 2442 and the control main circuit 246. The second terminal of the capacitor CSS is coupled to the ground terminal GND. The capacitor CSS may be charged according to the output current Ic to generate the first reference voltage SS.

In the present embodiment, the controllable current source 2442 may include a first current source circuit CUR1, a second current source circuit CUR2, and a current switch MS. The first current source circuit CUR1 is coupled between a power terminal VP and the first terminal of the capacitor CSS and is configured to generate a first current I1. The second current source circuit CUR2 is coupled between the power terminal VP and the current switch MS and is configured to generate a second current I2. The current switch MS is coupled between the second current source circuit CUR2 and the first terminal of the capacitor CSS and is controlled by the adjustment signal SA.

More specifically, when the current switch MS is turned off, the controllable current source 2442 uses the first current I1 as the output current Ic to charge the capacitor CSS, so that the first reference voltage SS rises at the first slope (i.e., the slope of the first reference voltage SS is equal to the first slope). Conversely, when the current switch MS is turned on in response to the adjustment signal SA, the controllable current source 2442 uses the sum of the first current I1 and the second current I2 as the output current Ic to charge the capacitor CSS, so that the first reference voltage SS rises at the second slope (i.e., the slope of the first reference voltage SS is equal to the second slope).

The control main circuit 246 may include an operational amplifier 2462 and a transistor MN1. The non-inverting input terminal of the operational amplifier 2462 is coupled to the voltage division circuit 242 to receive the feedback voltage VF. The inverting input terminal of the operational amplifier 2462 is coupled to the reference voltage generating circuit 244 to receive the first reference voltage SS. The first terminal of the transistor MN1 is coupled to the ground terminal GND. The control terminal of the transistor MN1 is coupled to the output terminal of the operational amplifier 2462. The second terminal of the transistor MN1 provides the control signal VG.

Figure 4:
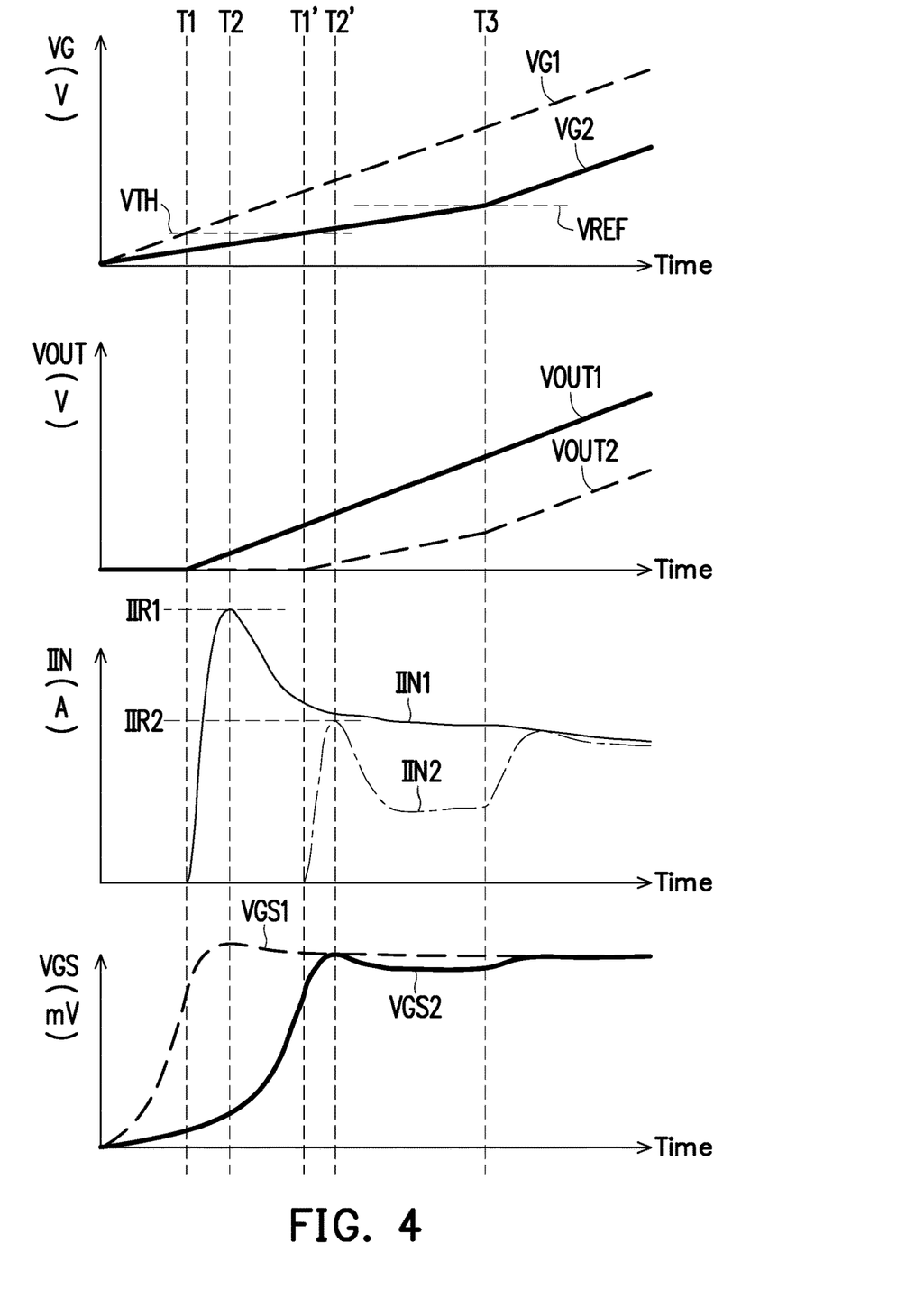
FIG. 4 and FIG. 5 are signal timing diagrams of the power circuit according to an embodiment of the invention.
Figure 5:
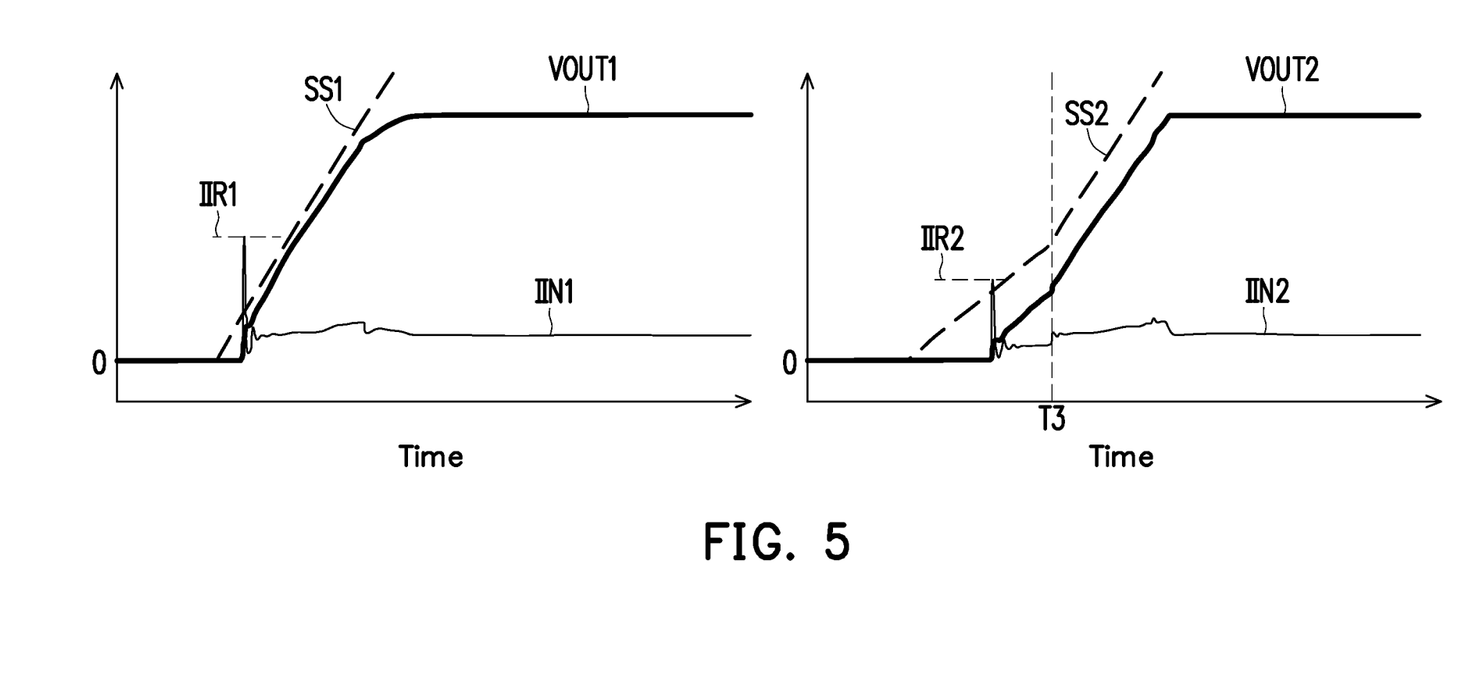

Referring to FIG. 1 to FIG. 5 together, FIG. 4 and FIG. 5 are signal timing diagrams of the power circuit 100 according to an embodiment of the invention. A control signal VG1, an output voltage VOUT1, an input current IIN1, and a voltage difference VGS1 shown in FIG. 4 are respectively signal waveforms of the control signal VG, the output voltage VOUT, the input current IIN, and a voltage difference VGS between the gate and the source of the power transistor MP in the application scenario in which the current switch MS of FIG. 3 is always in the turn-on state. A control signal VG2, an output voltage VOUT2, an input current IIN2, and a voltage difference VGS2 shown in FIG. 4 respectively represent signal waveforms of the control signal VG, the output voltage VOUT, the input current IIN, and the voltage difference VGS between the gate and the source of the power transistor MP in the application scenario in which the current switch MS of FIG. 3 is controlled by the adjustment signal SA. In addition, a first reference voltage SS1, an output voltage VOUT1, and an input current IIN1 shown in FIG. 5 are respectively signal waveforms of the first reference voltage SS, the output voltage VOUT, and the input current IIN in the application scenario in which the current switch MS of FIG. 3 is always in the turn-on state. A first reference voltage SS2, an output voltage VOUT2, and an input current IIN2 shown in FIG. 5 are respectively signal waveforms of the first reference voltage SS, the output voltage VOUT, and the input current IIN in the application scenario in which the current switch MS of FIG. 3 is controlled by the adjustment signal SA.

First, the application scenario in which the current switch MS of FIG. 3 is always in the turn-on state will be described.

When the power circuit 100 is started, the transistor MN1 is preset in a full turn-on state, so the voltage of the control signal VG (VG1) is the voltage of the ground terminal GND, and the power transistor MP is in the turn-off state. Since the current switch MS is in the turn-on state, the controllable current source 2442 uses the sum of the first current I1 and the second current I2 as the output current Ic to charge the capacitor CSS, so that the first reference voltage SS (SS1) rises at the second slope (i.e., the slope of the first reference voltage SS (SS1) is equal to the second slope), and the control signal VG (VG1) also rises at the second slope. At time point T1, the voltage of the control signal VG (VG1) rises to be equal to a threshold voltage VTH of the power transistor MP, so the power transistor MP is turned on, and the output voltage VOUT (VOUT1) starts to rise at the second slope until the output voltage VOUT (VOUT1) is equal to the input voltage VIN. When the power transistor MP is turned on at time point T1, the input current IIN (IIN1) starts to rise sharply and reaches the maximum value (i.e., an inrush current IIR1) at time point T2, and the voltage difference VGS (VGS1) between the gate and the source of the power transistor MP reaches the maximum value at time point T2. In an embodiment of the invention, in the case where the input voltage VIN is 12 volts, the capacitance value of the capacitor CSS is 100 nanofarads (nF), and the first current I1 and the second current I2 are both 5 microamps, the maximum of the voltage difference VGS1 between the gate and the source of the power transistor MP may be 1.083 volts, and the inrush current IIR1 may be 5.6 amps or more. Such a large inrush current IIR1 may damage the power transistor MP.

Another application scenario in which the current switch MS of FIG. 3 is controlled by the adjustment signal SA will be described below. When the power circuit 100 is started, the transistor MN1 is preset in the full turn-on state, so the voltage of the control signal VG (VG2) is the voltage of the ground terminal GND, and the power transistor MP is in the turn-off state. Since the voltage (which is the voltage of the ground terminal GND) of the control signal VG (VG2) is less than the second reference voltage VREF, the comparator CMP1 outputs, for example, an adjustment signal SA of a logic high level, so that the current switch MS is in the turn-off state. In this case, the controllable current source 2442 only uses the first current I1 as the output current Ic to charge the capacitor CSS, so that the first reference voltage SS (SS2) rises at the first slope (i.e., the slope of the first reference voltage SS (SS2) is equal to the first slope), and the control signal VG (VG2) also rises at the first slope. The first slope is less than the second slope.

At time point T1', the voltage of the control signal VG (VG2) rises to be equal to the threshold voltage VTH of the power transistor MP, so the power transistor MP is turned on, and the output voltage VOUT (VOUT2) starts to rise at the first slope. When the power transistor MP is turned on at time point T1', the input current IIN (IIN2) starts to rise sharply and reaches the maximum value (i.e., an inrush current IIR2) at time point T2', and the voltage difference VGS (VGS2) between the gate and the source of the power transistor MP reaches the maximum value at time point T2'. Since the first slope is less than the second slope, the voltage difference VGS2 is less than the voltage difference VGS1, and the inrush current IIR2 is less than the inrush current IIR1. In an embodiment of the invention, in the case where the input voltage VIN is 12 volts, the capacitance value of the capacitor CSS is 100 nanofarads, and the first current I1 and the second current I2 are both 5 microamps, the maximum value of the voltage difference VGS2 may be reduced to 1.019 volts, and the inrush current IIR2 may be reduced to 3.4 amps. This not only prevents the input voltage VIN from suddenly dropping due to an excessively large inrush current, but also prevents the power transistor MP from being damaged by the excessively large inrush current.

Next, at time point T3, the voltage of the control signal VG (VG2) rises to be greater than or equal to the second reference voltage VREF, so the comparator CMP1 outputs, for example, an adjustment signal SA of a logic low level to turn on the current switch MS. In this case, the controllable current source 2442 uses the sum of the first current I1 and the second current I2 as the output current Ic to charge the capacitor CSS, so that the first reference voltage SS (SS2) rises by the second slope (i.e., the slope of the first reference voltage SS (SS2) is equal to the second slope). In addition, the control signal VG (VG2) and the output voltage VOUT (VOUT2) also rise at the second slope until the output voltage VOUT (VOUT2) is equal to the input voltage VIN.

Figure 6:
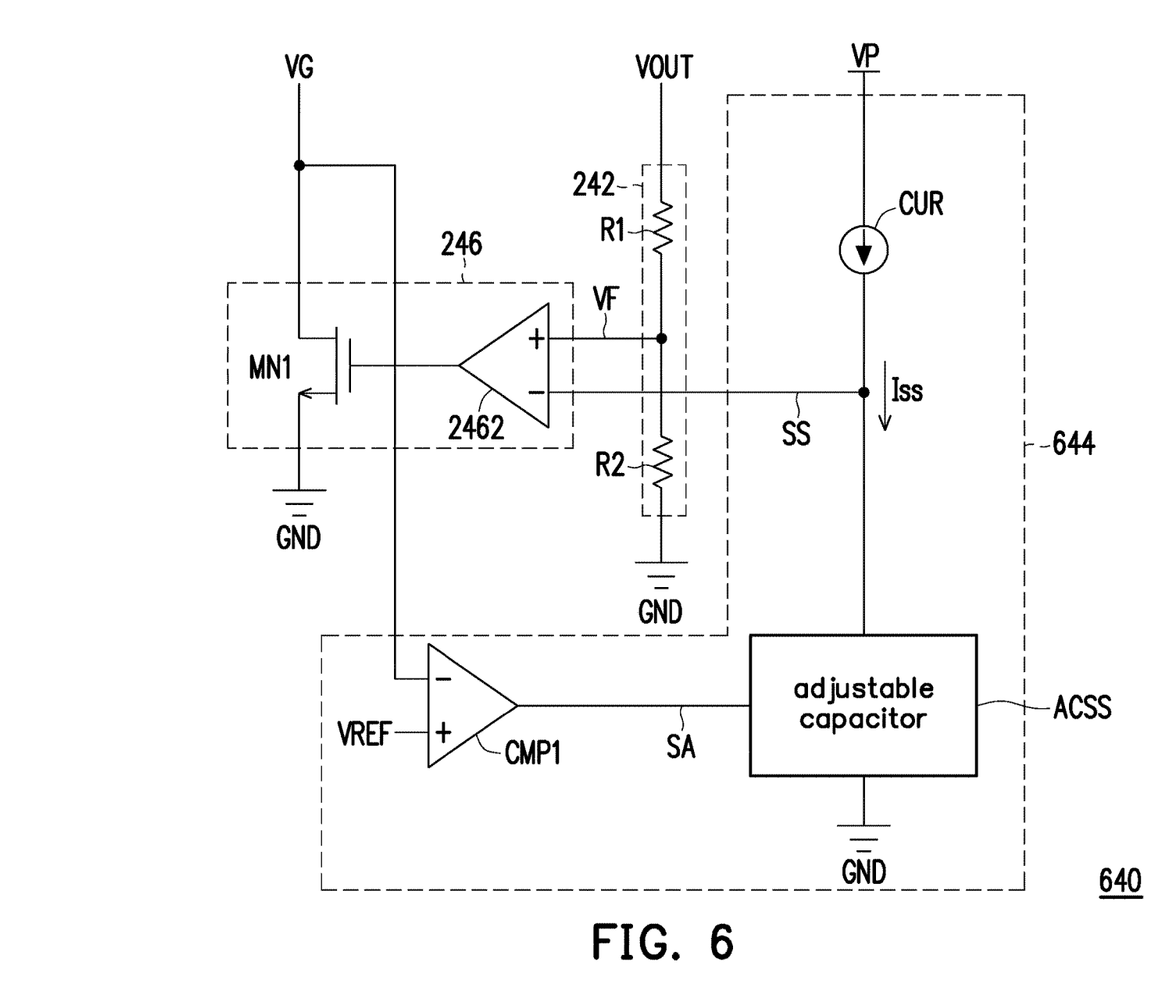
FIG. 6 is a circuit architecture diagram showing a soft start control circuit according to another embodiment of the invention.

FIG. 6 is a circuit architecture diagram showing a soft start control circuit 640 according to another embodiment of the invention. The soft start control circuit 640 similarly includes a voltage division circuit 242, a reference voltage generating circuit 644, and a control main circuit 246, and the voltage division circuit 242 and the control main circuit 246 shown in FIG. 6 are respectively similar to the voltage division circuit 242 and the control main circuit 246 of FIG. 3. Therefore, reference may be made to FIG. 3 above for relevant descriptions, which shall not be repeated herein.

Compared with the reference voltage generating circuit 244 of FIG. 3 which adjusts the output current Ic of the controllable current source 2442 through the adjustment signal SA to thereby adjust the slope of the first reference voltage SS, the reference voltage generating circuit 644 of FIG. 6 adjusts the capacitance value through the adjustment signal SA to thereby adjust the slope of the first reference voltage SS. Specifically, the reference voltage generating circuit 644 may include a comparator CMP1, a current source CUR, and an adjustable capacitor ACSS. The comparator CMP1 may compare the control signal VG with the second reference voltage VREF to generate the adjustment signal SA. The current source CUR provides a charging current Iss. The adjustable capacitor ACSS is coupled between the current source CUR and the ground terminal GND and is configured to be charged according to the charging current Iss to generate the first reference voltage SS. In particular, the adjustable capacitor ACSS may adjust the capacitance value of the adjustable capacitor ACSS according to the adjustment signal SA to thereby adjust the slope of the first reference voltage SS.

For example, when the voltage of the control signal VG is less than the second reference voltage VREF, the comparator CMP1 may output, for example, an adjustment signal SA of the logic high level, so that the adjustable capacitor ACSS sets the capacitance value of the adjustable capacitor ACSS to a first capacitance value according to the adjustment signal SA of the logic high level. In this case, the current source CUR charges the adjustable capacitor ACSS having the capacitance value being the first capacitance value by using the charging current Iss, so that the first reference voltage SS rises by the first slope (i.e., the slope of the first reference voltage SS is equal to the first slope).

Conversely, when the voltage of the control signal VG is greater than or equal to the second reference voltage VREF, the comparator CMP1 may output, for example, an adjustment signal SA of the logic low level, so that the adjustable capacitor ACSS sets the capacitance value of the adjustable capacitor ACSS to a second capacitance value according to the adjustment signal SA of the logic low level, and the second capacitance value is less than the first capacitance value. In this case, the current source CUR charges the adjustable capacitor ACSS having the capacitance value being the second capacitance value by using the charging current Iss, so that the first reference voltage SS rises at the second slope (i.e., the slope of the first reference voltage SS is equal to the second slope), and the first slope is less than the second slope.

In an embodiment of the invention, the adjustable capacitor ACSS may be implemented by using a currently available switched capacitor circuit, but the invention is not limited thereto.

In addition, the operation details of the soft start control circuit 640 of FIG. 6 operated with the power transistor MP of FIG. 2 may be inferred from relevant descriptions of the embodiments of FIG. 1 to FIG. 5 and shall not be repeatedly described herein.

In summary of the above, in the power circuit provided in the embodiments of the invention, the soft start control circuit turns on the switching circuit by using a control signal having the slope being the first slope, and after the switching circuit is turned on and when the voltage value of the control signal is equal to the second reference voltage, the soft start control circuit switches the slope of the control signal from the first slope to the second slope. Since the first slope is less than the second slope, the inrush current generated at the time when the switching circuit is turned on can be reduced to prevent the input voltage from suddenly dropping due to an excessively large inrush current and prevent the switching circuit from being damaged by the excessively large inrush current.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A power circuit comprising:
   a switching circuit, wherein a first terminal of the switching circuit is configured to receive an input voltage, a control terminal of the switching circuit is configured to receive a control signal, and a second terminal of the switching circuit is configured to provide an output voltage; and
   a soft start control circuit, coupled to the second terminal of the switching circuit to receive the output voltage and configured to generate the control signal according to both the output voltage and a first reference voltage to control a turn-on state of the switching circuit,
   wherein after the switching circuit is turned on and when a voltage value of the control signal is equal to a second reference voltage, the soft start control circuit switches a slope of the control signal from a first slope to a second slope larger than the first slope so as to adjust a slope of the output voltage from the first slope of the control signal to the second slope of the control signal,
   wherein both the first slope of the control signal and the second slope of the control signal serve to perform a soft start operation to reduce an inrush current when the switching circuit is turned on.

2. The power circuit according to claim 1, wherein the switching circuit is a power transistor, and the second reference voltage is greater than a threshold voltage of the power transistor.

3. The power circuit according to claim 1, wherein after the switching circuit is turned on and when the voltage value of the control signal is equal to the second reference voltage, the soft start control circuit switches a slope of the first reference voltage from the first slope to the second slope, so that the soft start control circuit switches the slope of the control signal from the first slope to the second slope according to the output voltage and the first reference voltage.

4. The power circuit according to claim 1, wherein the soft start control circuit comprises:
   a voltage division circuit, coupled to the second terminal of the switching circuit to receive the output voltage, and dividing the output voltage to generate a feedback voltage;
   a reference voltage generating circuit, configured to generate the first reference voltage and adjust a slope of the first reference voltage according to the control signal and the second reference voltage; and
   a control main circuit, coupled to the voltage division circuit to receive the feedback voltage, coupled to the reference voltage generating circuit to receive the first reference voltage, and generating the control signal according to the feedback voltage and the first reference voltage.

5. The power circuit according to claim 4, wherein:
   when the voltage value of the control signal is less than the second reference voltage, the slope of the first reference voltage generated by the reference voltage generating circuit is the first slope, and
   when the voltage value of the control signal is greater than the second reference voltage, the slope of the first reference voltage generated by the reference voltage generating circuit is the second slope.

6. The power circuit according to claim 4, wherein the reference voltage generating circuit comprises:
   a comparator, configured to compare the control signal with the second reference voltage to generate an adjustment signal;
   a controllable current source, coupled to the comparator to receive the adjustment signal, and adjusting an output current of the controllable current source according to the adjustment signal; and
   a capacitor, wherein a first terminal of the capacitor is coupled to the controllable current source and the control main circuit, a second terminal of the capacitor is coupled to a ground terminal, and the capacitor is charged according to the output current to generate the first reference voltage.

7. The power circuit according to claim 6, wherein the controllable current source comprises:
   a first current source circuit, coupled between a power terminal and the first terminal of the capacitor and configured to generate a first current;
   a second current source circuit, coupled to the power terminal and configured to generate a second current; and
   a current switch, coupled between the second current source circuit and the first terminal of the capacitor and controlled by the adjustment signal,
   wherein when the current switch is turned off, the controllable current source uses the first current as the output current to charge the capacitor, so that the slope of the first reference voltage is equal to the first slope, and
   when the current switch is turned on in response to the adjustment signal, the controllable current source uses a sum of the first current and the second current as the output current to charge the capacitor, so that the slope of the first reference voltage is equal to the second slope.

8. The power circuit according to claim 4, wherein the reference voltage generating circuit comprises:
   a comparator, configured to compare the control signal with the second reference voltage to generate an adjustment signal;
   a current source, configured to provide a charging current; and
   an adjustable capacitor, coupled between the current source and a ground terminal and configured to be charged according to the charging current to generate the first reference voltage,
   wherein the adjustable capacitor adjusts a capacitance value of the adjustable capacitor according to the adjustment signal to adjust the slope of the first reference voltage.

9. The power circuit according to claim 4, wherein the control main circuit comprises:
   an operational amplifier, wherein a non-inverting input terminal of the operational amplifier is coupled to the voltage division circuit to receive the feedback voltage, and an inverting input terminal of the operational amplifier is coupled to the reference voltage generating circuit to receive the first reference voltage; and
   a transistor, wherein a first terminal of the transistor is coupled to a ground terminal, a control terminal of the transistor is coupled to an output terminal of the operational amplifier, and a second terminal of the transistor provides the control signal.

\* \* \* \* \*